United States Patent
Duch et al.

(10) Patent No.: US 7,583,527 B2
(45) Date of Patent: Sep. 1, 2009

(54) TUNABLE RESISTOR AND METHOD FOR OPERATING A TUNABLE RESISTOR

(75) Inventors: Alexander Duch, Paris (FR); Michael Kund, Tuntenhausen (DE)

(73) Assignees: Infineon Technologies AG, Munich (DE); Altis Semiconductor, SNC, Corbeil Essonnes Cedex (FR)

( * ) Notice: Subject to any disclaimer, the term of this patent is extended or adjusted under 35 U.S.C. 154(b) by 0 days.

(21) Appl. No.: 11/541,443

(22) Filed: Sep. 29, 2006

(65) Prior Publication Data
US 2008/0080227 A1 Apr. 3, 2008

(51) Int. Cl.
*G11C 11/00* (2006.01)
(52) U.S. Cl. .......................... 365/158; 365/171; 365/173
(58) Field of Classification Search ................ 365/158, 365/171, 173
See application file for complete search history.

(56) References Cited

U.S. PATENT DOCUMENTS

| | | | |
|---|---|---|---|
| 6,252,795 B1 | 6/2001 | Hansen et al. | |
| 6,944,050 B2 * | 9/2005 | Kang et al. | 365/158 |
| 7,215,564 B2 | 5/2007 | Happ et al. | |
| 7,286,378 B2 * | 10/2007 | Nazarian | 365/46 |
| 2004/0251988 A1 | 12/2004 | Sharma et al. | |
| 2005/0259495 A1 | 11/2005 | Chung | |
| 2006/0092689 A1 | 5/2006 | Braun et al. | |

FOREIGN PATENT DOCUMENTS

| | | |
|---|---|---|
| DE | 10237876 A1 | 3/2003 |
| DE | 10297786 T5 | 8/2005 |
| DE | 102004020575 B3 | 8/2005 |
| DE | 69825923 T2 | 9/2005 |
| DE | 102005052508 A1 | 5/2006 |
| EP | 1235227 A2 | 8/2002 |
| GB | 2407707 A | 5/2005 |

OTHER PUBLICATIONS

Tehrani, S., et al., "Recent Developments in Magnetic Tunnel Junction MRAM," IEEE Transactions on Magnetics, vol. 36, No. 5, Sep. 2000, pp. 2752-2757.

DeBrosse, J., et al., "A High Speed 128-kb MRAM Core for Future Universal Memory Applications," IEEE Journal of Solid-State Circuits, vol. 39, No. 4, Apr. 2004, pp. 678-683.

* cited by examiner

*Primary Examiner*—Son Dinh
*Assistant Examiner*—Nam Nguyen
(74) *Attorney, Agent, or Firm*—Slater & Matsil, L.L.P.

(57) ABSTRACT

A tunable resistor includes a resistor input terminal, a resistor output terminal, and at least one current path connected between the resistor input terminal and the resistor output terminal. The at least one current path runs through at least one memory cell of an arrangement of programmable microelectronic memory cells. A resistance adjuster adjusts the current path resistances of the current paths by programming the memory states of corresponding memory cells or which activates/deactivates current paths such that the overall resistance between the resistor input terminal and the resistor output terminal is set to a predetermined resistance target value.

26 Claims, 6 Drawing Sheets

$R_{on}$ state $R_{off}$ state

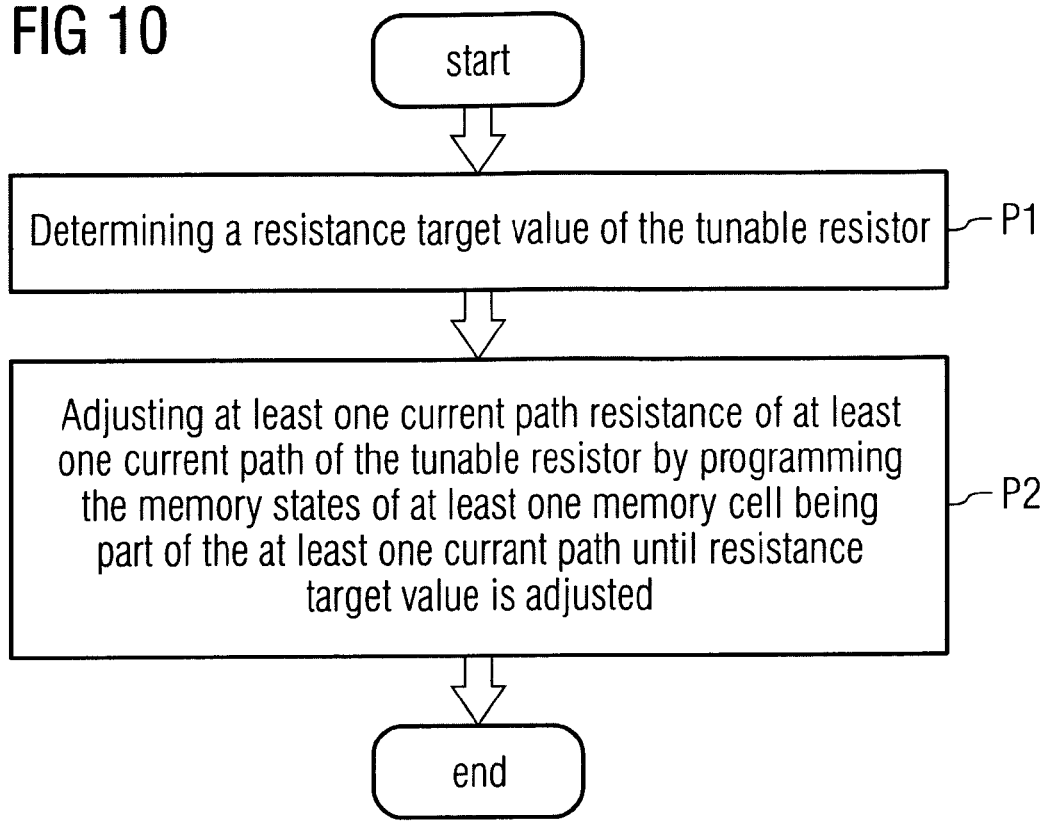
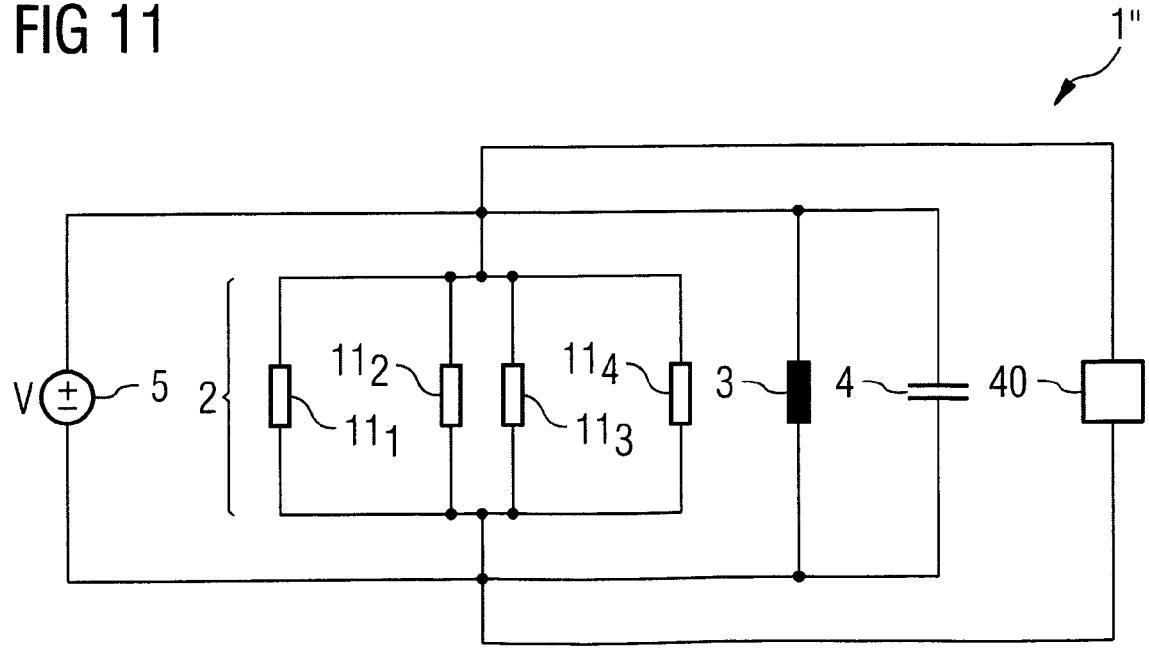

TUNABLE RESISTOR AND METHOD FOR OPERATING A TUNABLE RESISTOR

TECHNICAL FIELD

The invention relates to a tunable resistor as well as a method for operating a tunable resistor.

BACKGROUND

Tunable resistors are standard components of electrical circuit arrangements. It is desirable to develop new types of tunable resistors in order to improve the efficiency of said circuit arrangements.

SUMMARY OF THE INVENTION

According to one embodiment of the present invention, a tunable resistor includes a resistor input terminal, a resistor output terminal, and at least one current path connected between the resistor input terminal and the resistor output terminal. The current path(s) runs through at least one memory cell of an arrangement of programmable microelectronic memory cells. A resistance adjusting means adjusts the current path resistances of the current paths by programming the memory states of corresponding memory cells or activates/deactivates current paths such that the overall resistance between the resistor input terminal and the resistor output terminal is set to a predetermined resistance target value.

BRIEF DESCRIPTION OF THE DRAWINGS

For a more complete understanding of the present invention and the advantages thereof, reference is now made to the following description taken in conjunction with the accompanying drawings, in which:

FIG. 10 provides a flow diagram of a method of operating a tunable resistor; and FIG. 11 shows a schematic diagram of an RLC circuit.

DETAILED DESCRIPTION OF ILLUSTRATIVE EMBODIMENTS

Figure 1:
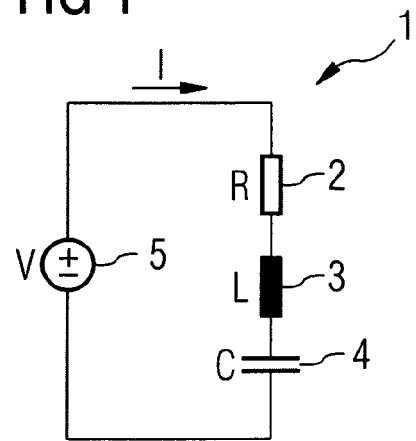
FIG. 1 shows a first example of a RLC circuit.

According to one embodiment of the present invention, a tunable resistor includes a resistor input terminal, a resistor output terminal, and at least one current path connected between the resistor input terminal and the resistor output terminal. The at least one current path runs through at least one memory cell of an arrangement of programmable microelectronic memory cells. A resistance adjusting means adjusts the current path resistances of the current paths by programming the memory states of corresponding memory cells and/or activates/deactivates current paths such that the overall resistance between the resistor input terminal and the resistor output terminal is set to a predetermined resistance target value.

According to an embodiment of the present invention, the resistance adjusting means both programs the memory states of memory cells and activates/deactivates current paths in order to tune the resistance.

The memory cells are resistive memory cells used as parts of a current path (a current flows through the memory cells) having a tunable resistance (dependent on the "memory state" of the memory cells), respectively.

Within the scope of the present invention, the term "arrangement of programmable microelectronic memory cells" may for example mean a "stand alone" memory device normally used in computing devices for storing information (i.e., the memory device is "abused" as a tunable resistor), but also includes the more general case of an arrangement of programmable resistance units, the resistance units corresponding in their physical dimensions, their architecture or their electrical properties substantially to the physical dimensions, the architecture or the electrical properties of normal "stand alone" memory devices although the arrangement of programmable resistance units may not be usable as "stand alone" memory device (for example, the resistances of the memory cells may vary among each other significantly, which is not allowed in a "stand alone" memory device where the resistances of all memory cells have to be substantially the same). Further, the term "arrangement of programmable microelectronic memory cells" may mean one single memory cell or a plurality (two or more) of memory cells.

Within the scope of the present invention, the term "activating a current path" means allowing current to flow through the current path, the term "deactivating a current path" means not allowing current to flow through the current path.

According to one embodiment of the present invention, the memory cells are non-volatile memories cells. Advantage of this embodiment is that even after having switched off the tunable resistor, the resistance of the tunable resistor is maintained. As a consequence, it is not necessary to retune the resistance of the tunable resistor when switching the tunable resistor on again at a later point of time.

According to an embodiment of the present invention, at least one memory cell includes a current path input terminal and a current path output terminal, the current path input terminal and the current path output terminal terminals being used by the resistance adjusting means for applying a programming voltage across the memory cell in order to program the memory cell. Advantage of this embodiment is that only two terminals are needed for both using the memory cell as resistor and tuning the resistance of the memory cell. That is, the current path input terminal and the current path output terminal of a memory cell are used both as parts of a current path and as programming terminals programming the memory state of the memory cell in order to change it resistance. As a consequence, the dimensions of the tuneable resistor can be scaled down significantly since each memory cell does only need two terminals, no space for additional terminals is needed.

According to a further embodiment of the present invention, the resistor is realized as a concatenation of several current paths that are connected in series, in parallel, or in series and in parallel.

According to one embodiment of the present invention, at least one of the programmable memory cells is a solid electrolyte random access memory cell, in the following also referred to as "conductive bridging random access memory (CBRAM) cell." In this embodiment, the resistance adjusting means programs the memory state of the CBRAM cells by forming or erasing conductive paths within the CBRAM cells, thereby adjusting the resistance of the CBRAM cells.

According to one embodiment of the present invention, at least one of the programmable memory cells is a magneto resistive random access memory (MRAM) cell. In this embodiment, the resistance adjusting means programs the memory states of the MRAM cells by changing the magnetical orientation of the MRAM cells, thereby adjusting the resistance of the MRAM cells.

According to one embodiment of the present invention, at least one of the programmable memory cells is a phase change random access memory (PCRAM) cell. In this embodiment, the resistance adjusting means programmes the memory states of the PCRAM cells by causing phase transitions within the PCRAM cells, thereby adjusting the resistance of the PCRAM cells.

According to one embodiment of the present invention, a RLC circuit is provided, including a tunable resistor having a resistor input terminal, a resistor output terminal, and at least one current path connected between the resistor input terminal and the resistor output terminal, wherein at least one current path runs through at least one memory cell of an arrangement of programmable microelectronic memory cells, an inductor, a capacitor, and resistance adjusting means adjusting the current path resistances of the current paths by programming the memory states of corresponding memory cells or which activates/deactivates current paths such that the overall resistance between the resistor input terminal and the resistor output terminal is set to a predetermined resistance target value.

In this embodiment, the impendence of the inductor may be tunable. Further, the capacitance of the capacitor may be tunable. Within the scope of the present invention, the term "RLC circuit" also includes the case that the resistance, the impedance or the capacitance are independently tuned to the value zero, respectively.

According to a further embodiment of the present invention, a method for operating a tunable resistor is provided. The tunable resistor includes a resistor input terminal, a resistor output terminal, and at least one current path connected between the resistor input terminal and the resistor output terminal, wherein at least one current path runs through at least one memory cell of an arrangement of programmable microelectronic memory cells. The method includes determining a resistance target value and adjusting the current path resistances of the current paths by programming the memory states of corresponding memory cells or activating/deactivating current paths such that the overall resistance between the resistor input terminal and the resistor output terminal is set to a predetermined resistance target value.

All embodiments discussed above in conjunction with the tunable resistor may also be applied to the method according to this embodiment. For example, the memory cells may comprise CBRAM cells, MRAM cells or PCRAM cells.

According to a further embodiment according to the present invention, a method for operating a RLC circuit is provided. The RLC circuit includes a tunable resistor, an inductor, and a capacitor, wherein at least a part of the resistor is realized as a current path including at least one programmable microelectronic memory cell. The method includes determining a resistance target value and programming the memory state of at least one memory cell of the current path such that the resulting overall resistance of the current path is set to the resistance target value.

In this embodiment, the impedance of the inductor may be tunable. Further, the capacitance of the capacitor may be tunable. Within the scope of the present invention, the term "RLC circuit" also includes the case that the resistance, the impedance or the capacitance are independently set to the value zero, respectively.

According to an embodiment of the present invention, a computer program is provided adapted to perform, when being carried out on a computing device or a digital signal processor, a method for operating a tunable resistor having a resistor input terminal, a resistor output terminal, and at least one current path connected between the resistor input terminal and the resistor output terminal, wherein at least one current path runs through at least one memory cell of an arrangement of programmable microelectronic memory cells. The method includes determining a resistance target value and adjusting the current path resistances of the current paths by programming the memory states of corresponding memory cells or activating/deactivating current paths such that the overall resistance between the resistor input terminal and the resistor output terminal is set to a predetermined resistance target value.

According to a further embodiment of the present invention, a computer program is provided adapted to perform, when being carried out on a computing device or a digital signal processor, a method for operating a RLC circuit including a tunable resistor, an inductor and a capacitor, wherein at least a part of the resistor is realized as a current path having at least one programmable microelectronic memory cell. The method includes determining a resistance target value and programming the memory state of at least one memory cell of the memory path such that the resulting overall resistance of the current path is set to the resistance target value.

Further, according to one embodiment of the present invention, a data carrier storing computer programs as described above is provided.

Figure 2:
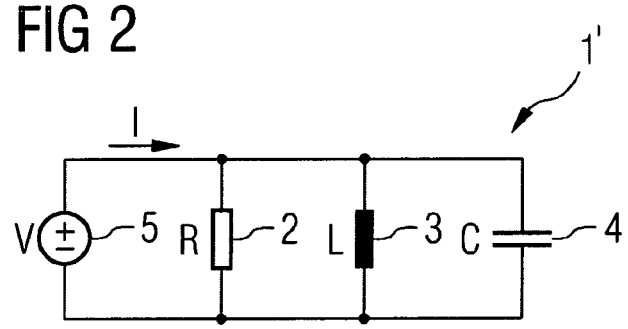
FIG. 2 shows a second example of a RLC circuit.

Circuit arrangements including tunable resistors are known. An example of such a circuit arrangement is a RLC circuit (also known as "resonant circuit" or "tuned circuit"). An RLC circuit is an electrical circuit including a resistor (R), an inductor (L), and a capacitor (C) connected in series or in parallel. FIGS. 1 and 2 show examples of RLC circuits. In FIG. 1, an RLC circuit 1 includes a resistor 2, an inductor 3, a capacitor 4, and a voltage source 5 connected in series. FIG. 2 shows an RLC circuit 1' having a resistor 2, an inductor 3, a capacitor 4, and a voltage source 5 connected in parallel.

Figure 3:
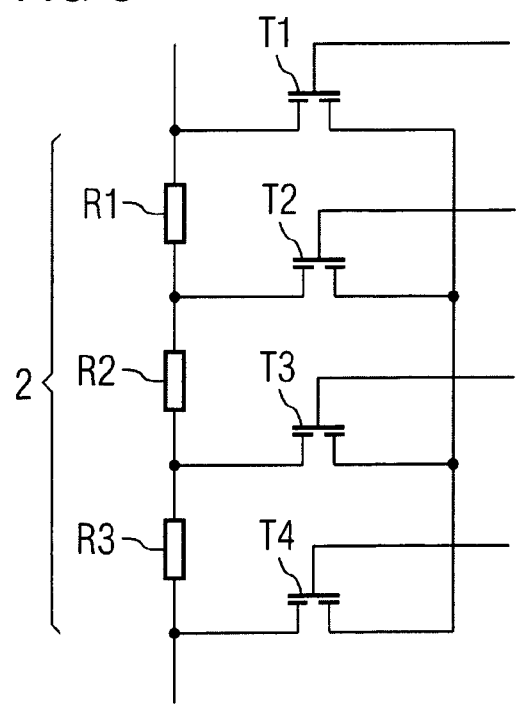
FIG. 3 shows an example of a tunable resistor that may be employed in the RLC circuits shown in FIGS. 1 and 2.

The electrical properties of the RLC circuits 1, 1' shown in FIGS. 1 and 2 can be changed by changing the resistance of the resistor 2, the impedance of the inductor 3, and the capacitance of the capacitor 4 as well as by adding single resistors, inductors and capacitors or groups of these elements to the RLC circuits (in parallel or in series). For example, as shown in FIG. 3, the resistor 2 shown in FIGS. 1 and 2 may comprise several resistors R1, R2, R3 connected in series. The resistance of the resistor 2 can be tuned by transistors T1, T2, T3, and T4 (the transistors selectively enable or disable the resistors R1, R2 and R3).

A disadvantage of the tunable resistor shown in FIG. 3 is that the space required for both the resistors R1, R2, and R3 and the transistors T1, T2 and T3 may be relatively large.

Figure 4:
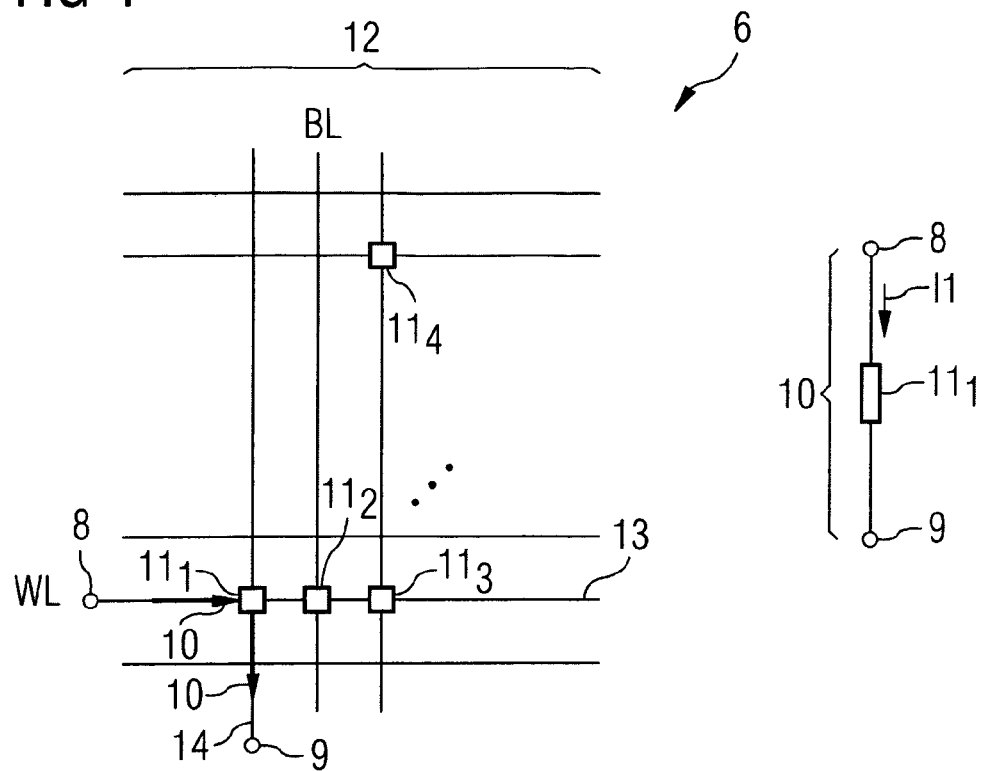
FIG. 4 shows a schematic top view of one embodiment of a tunable resistor according to the present invention.

The left part of FIG. 4 shows a top view of an embodiment 6 of a tunable resistor according to the present invention, including: a resistor input terminal 8, a resistor output terminal 9, and a first current path 10 connected between the resistor input terminal 8 and the resistor output terminal 9. The first current path 10 runs through a first programmable microelectronic memory cell $11_1$ of an arrangement 12 of programmable microelectronic memory cells 11 (not all memory cells 11 are shown). In this embodiment, the first current path 10 comprises a part of a first word line 13, the memory cell $11_1$ as well as a part of a first bit line 14. The first memory cell $11_1$ can be interpreted as electrical connection connecting the first word line 13 to the first bit line 14.

The programmable microelectronic memory cells 11 are resistive memory cells. In order to tune the resistance of the first current path 10, the memory state of the first programmable memory cell $11_1$ is switched between different memory states, for example two or three memory states), each memory state resulting in a different resistance of the first memory cell $11_1$. This means that the resistance which is experienced by a current I1 flowing through the first memory cell $11_1$ differs in dependence on the memory state of the first memory cell $11_1$. Assuming that the voltage driving the current I1 through the first memory cell $11_1$ is constant, the strength of the current I1 changes in dependence on the memory state of the first memory cell $11_1$: if the memory state of the first memory cell $11_1$ results in a high resistance, the current I1 will show a low current strength, whereas in the case that the memory state of the first memory cell $11_1$ results in a low resistance of the first memory cell $11_1$, the strength of the current I1 will be high.

According to an embodiment of the present invention, the memory state of the first memory cell $11_1$ is programmed by applying a voltage across the first current path 10, i.e., by applying a voltage between the resistor input terminal 8 and the resistor output terminal 9. This means that no additional programming elements like programming terminals have to be provided; the resistor input terminal 8 and the resistor output terminal 9 are used for both programming the first memory cell $11_1$ and as resistor terminals.

The right part of FIG. 4 shows the equivalent circuit of the embodiment 6 shown in the left part of FIG. 4.

Figure 5:
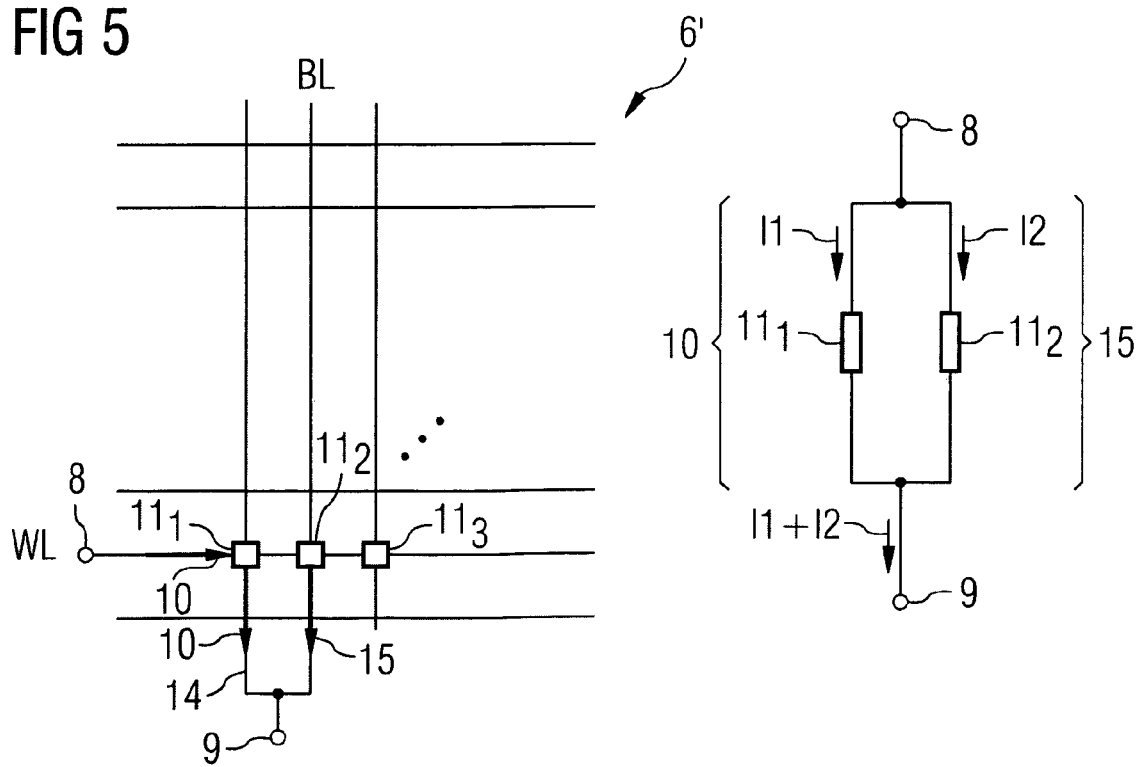
FIG. 5 shows a schematic top view of one embodiment of a tunable resistor according to the present invention.

The left part of FIG. 5 shows a further embodiment 6' of a tunable resistor according to the present invention. Compared to the tunable resistor 6 shown in FIG. 4, an additional second current path 14 is connected between the resistor input terminal 8 and the resistor output terminal 9. The additional current path 15 runs trough a second programmable memory cell $11_2$. Thus, when applying a voltage between the resistor input terminal 8 and the resistor output terminal 9, a first current I1 flows through the first memory cell $11_1$, and a second current 12 flows through the second memory cell $11_2$. The memory states of the first and second memory cells $11_1$, $11_2$ may be programmed by applying a programming voltage over the first and second memory cells $11_1$, $11_2$ using the resistor input terminal 8 and the resistor output terminal 6. In this way, the overall resistance between the resistor input terminal 8 and the resistor output terminal 9 (resistors connected in parallel) can be tuned.

The right part of FIG. 5 shows the equivalent circuit of the embodiment 6' shown in the left part of FIG. 5.

Figure 6:
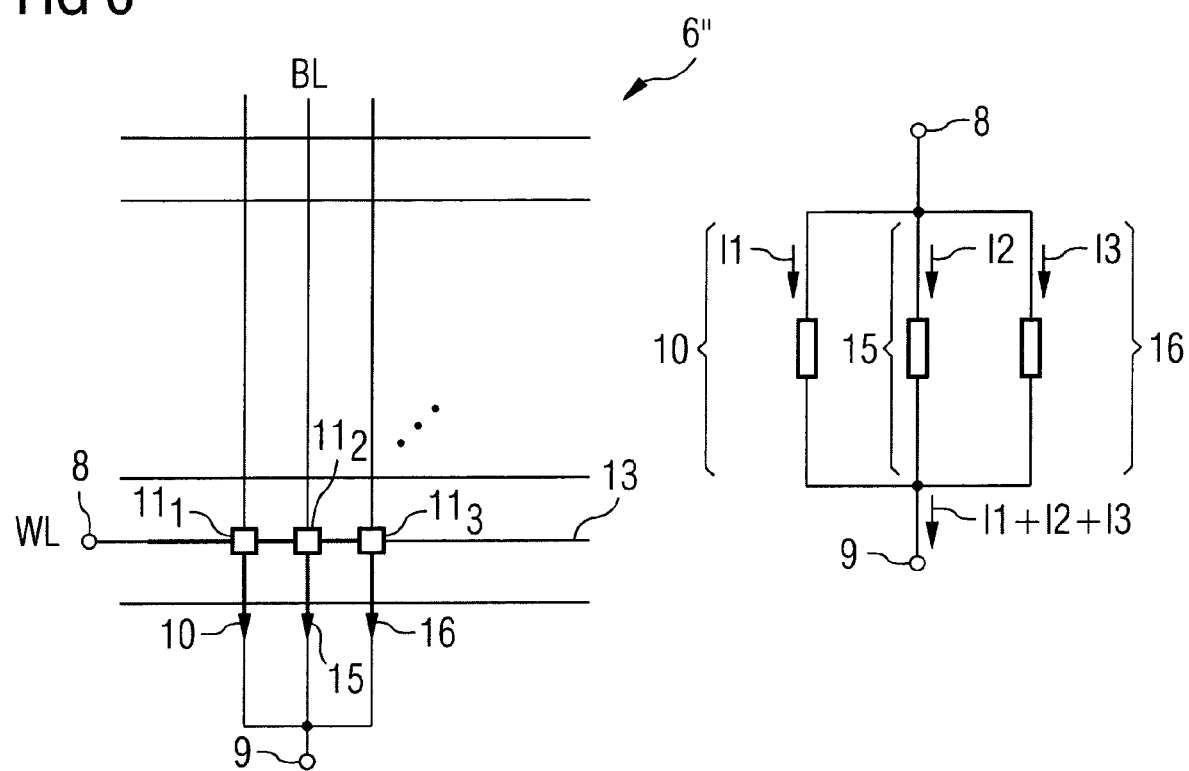
FIG. 6 shows a schematic top view of one embodiment of a tunable resistor according to the present invention.

The left part of FIG. 6 shows a further embodiment 6" of a tunable resistor according to the present invention which, compared to the circuit arrangement 6' shown in FIG. 5, comprises an additional third current path 16 connected between the resistor input terminal 8 and the resistor output terminal 9. The first to third current paths 10, 15 and 16 are connected in parallel, as shown in the equivalent circuit in the right part of FIG. 6. The resistor input terminal 8 and the resistor output terminal 9 may be used both as resistor terminals and as programming terminals of the first to third memory cells $11_1$ to $11_3$, as discussed in conjunction with the embodiments shown in FIGS. 4 and 5.

The right part of FIG. 6 shows the equivalent circuit of the embodiment 6" shown in the left part of FIG. 6.

The programmable memory cells 11 may be any kind of resistive programmable memory cell. The arrangement 12 of programmable microelectronic memory cells 11 may comprise only one memory cell up to an arbitrary number of memory cells 11. The arrangement 12 of programmable microelectronic memory cells may be an array of memory cells like in a "normal" memory device used for example in conjunction with computing devices for storing information, or may have a different architecture.

Figure 8:
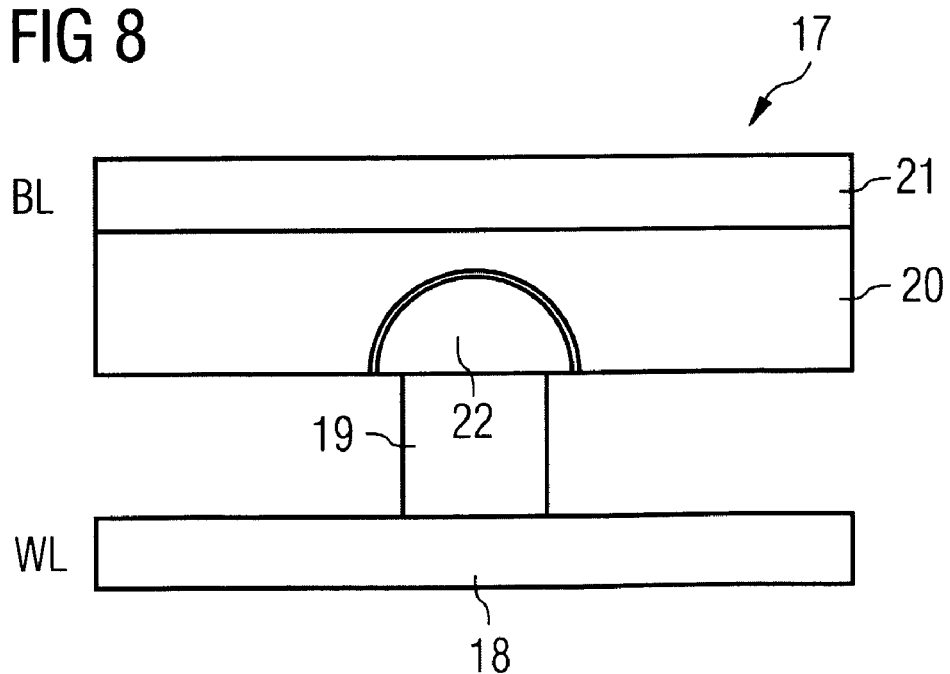
FIG. 8 shows a schematic cross-sectional view of an example of a programmable memory cell usable in the tunable resistor according to the present invention.

In an embodiment of the present invention, the programmable memory cells 11 are phase change random access memory (PCRAM) cells. FIG. 8 shows a schematic drawing illustrating the architecture of an embodiment of a PCRAM cell.

The PCRAM cell 17 shown in FIG. 8 comprises a bottom electrode 18, a heating element 19, a layer of active material (phase changing material) 20, and a top electrode 21 which are stacked above each other in this order. The layer of active material 20 is for example made of polycrystalline chalcogenide. If a programming voltage is applied between the top electrode 21 and the bottom electrode 18, an area 22 within the layer of active material 20 changes from a crystalline state into an amorphous state. By applying an erasing voltage between the top electrode 21 and the bottom electrode 18, the amorphous state of the area 22 can be changed back into the crystalline state. A current which flows from the top electrode 21 through the layer of active material 20 and through the heating element 19 to the bottom electrode 18 is influenced by the resistance of the area 22: the resistance experienced by the current flowing between the top electrode 21 and the bottom electrode 18 depends on the phase state of the material within the area 22. A higher resistance of the area 22 may for example represent "0", whereas a low resistance of the area 22 represents "1". The current flowing between the top electrode 21 and the bottom electrode 18 is (at least a part of) the current flowing through the tunable resistor according to the present invention.

Figure 7:
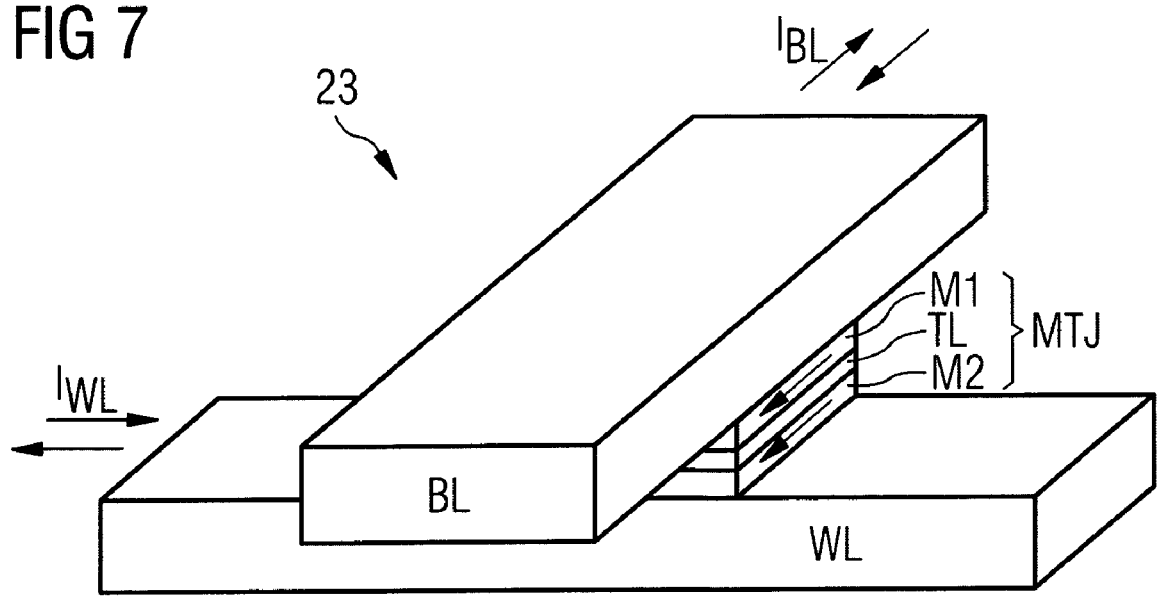
FIG. 7 shows a schematic perspective view of an example of a programmable memory cell usable in the tunable resistor according to the present invention.

In an embodiment of the present invention, the programmable memory cells 11 are magneto-resistive random access memory (MRAM) cells. FIG. 7 shows a schematic drawing illustrating the architecture of an embodiment of a MRAM cell.

FIG. 7 illustrates a magnetic tunnel junction (MTJ) stack (MRAM cell 23) capable of registering (or storing, or being programmed with) one bit. The memory cell 23 includes at least two ferromagnetic layers M1 and M2 that are separated by a tunnel layer TL. The memory cell 23 is positioned at the cross-point of two conductors, referred to as a word line WL and a bit line BL. One magnetic layer M1 is referred to as a free layer or a storage layer, and the other magnetic layer M2 is referred to as a fixed layer or a reference layer. Two publications describing the art of MRAMs are S. Tehrani, et al., "Recent Developments in Magnetic Tunnel Junction MRAM", IEEE Trans. on Magnetics, Vol. 36 Issue 5, September 2000, pp. 2752-2757, and J. DeBrosse, A. Bette at al., "A High Speed 128-kb MRAM Core for Future Universal Memory Applications," IEEE Journal of Solid State Circuits, Vol. 39, Issue 4, April 2004, pp. 678-683. The magnetic orientation of the free layer M1 can be changed by the superposition of the magnetic fields caused by a programming current IBL that is run through the bitline BL. and a programming current IWL that is run through the wordline WL. A bit, e.g., a "0" or "1", may be stored (or "programmed") in the memory cell 23 by changing the orientation of the field of the free magnetic layer M1 relative to that of the fixed magnetic layer M2. If both magnetic layers M1 and M2 have the same orientation, the memory cell 23 has a lower resistance RC. The resistance RC is higher if the magnetic layers M1, M2 have opposite magnetic orientations. The current flowing between the bit line BL and the word line WL is (at least a part of) the current flowing through the tunable resistor according to the present invention.

Figure 9A:
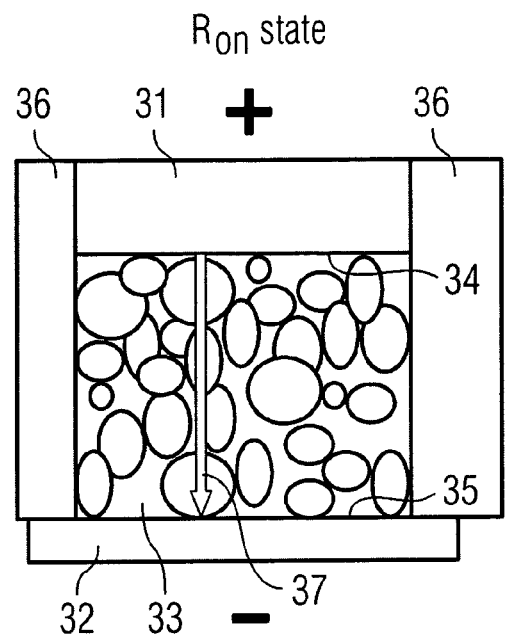
FIG. 9a shows a schematic cross-sectional view of an example of a programmable memory cell usable in the tunable resistor according to the present invention, the programmable memory cell being set to a first memory state.
Figure 9B:
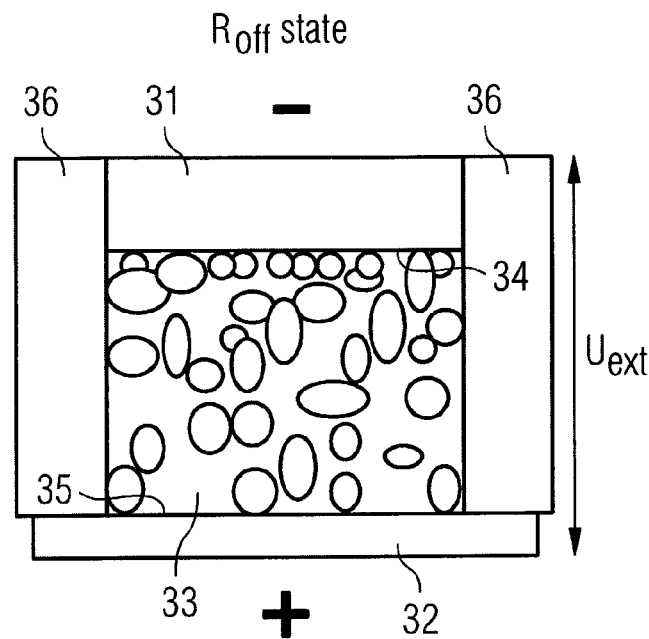
FIG. 9b shows a schematic cross-sectional view of the programmable memory cell shown in FIG. 9A in a second memory state.

FIGS. 9a and 9b show different memory states of a conductive bridging random access memory (CBRAM) cell 24 which may be used as programmable memory cell 11 in a tunable resistor according to the present invention.

As shown in FIG. 9a, a CBRAM cell comprises a first electrode 31, a second electrode 32, and a solid eletrolyte block 33 (in the following also referred to as ion conductor block) sandwiched between the first electrode 31 and the second electrode 32. The first electrode 31 contacts a first surface 34 of the ion conductor block 33, the second electrode 32 contacts a second surface 35 of the ion conductor block 33. The ion conductor block 33 is isolated against its environment by an isolation structure 36. The first surface 34 usually is the top surface, the second surface 35 the bottom surface of the ion conductor 33. In the same way, the first electrode 31 generally is the top electrode, and the second electrode 32 the bottom electrode of the CBRAM cell. One of the first electrode 31 and the second electrode 32 is a reactive electrode, the other one an inert electrode. Here, the first electrode 31 is the reactive electrode, and the second electrode 32 is the inert electrode. Further, in this example, the first electrode 31 includes silver (Ag), the ion conductor block 33 includes Ag-doped chalcogenide material, and the isolation structure 36 includes $SiO_2$.

If a voltage as indicated in FIG. 9a is applied across the ion conductor block 33, a redox reaction is initiated which drives $Ag^+$ ions out of the first electrode 31 into the ion conductor block 33 where they are reduced to Ag, thereby forming Ag rich clusters within the ion conductor block 33. If the voltage applied across the ion conductor block 33 is applied long enough, the size and the number of Ag rich clusters within the ion conductor block 33 is increased to such an extent that a conductive bridge 37 between the first electrode 31 and the second electrode 32 is formed. In case that a voltage is applied across the ion conductor 33 as shown in FIG. 9b (inverse voltage compared to the voltage applied in FIG. 9), a redox reaction is initiated which drives $Ag^+$ ions out of the ion conductor block 33 into the first electrode 31 where they are reduced to Ag. As a consequence, the size and the number of Ag rich clusters within the ion conductor block 33 is reduced, thereby erasing the conductive bridge 37.

In order to determine the current memory status of a CBRAM cell, a sensing current is routed through the CBRAM cell. The sensing current experiences a high resistance in case no conductive bridge 37 exists within the CBRAM cell, and experiences a low resistance in case a conductive bridge 37 exists within the CBRAM cell. A high resistance may for example represent "0," where else a low resistance represents "1," or vice versa. The current flowing between the reactive electrode 35 and the inert electrode 37 is (at least a part of) the current flowing through the tunable resistor according to the present invention.

FIG. 11 shows an RLC circuit 1" having a resistor 2, an inductor 3, a capacitor 4, and a voltage source 5 connected in parallel. The resistor 2 is a tunable resistor that includes a number of microelectronic memory cells $11_1$-$11_4$ coupled in parallel. A resistance adjusting means 40 is provided for adjusting the current path resistances of the current paths by programming the memory states of corresponding memory cells $11_1$-$11_4$ or activating/deactivating current paths such that the overall resistance between an input terminal of the resistor and an output terminal of the resistor is set to a predetermined resistance target value.

In the following description, further features of the present invention will be explained.

It is desirable to provide tunable signals with certain frequencies or tunable filters for certain frequencies. To do this, many applications for so-called tuned circuits (RLC circuit, resonant circuit) especially in radio and communication systems have been developed. The term "RLC circuit" here also comprises the case that R, L or C has the value zero. RLC circuits are used to select a certain narrow range of frequencies from the total spectrum of radio waves.

An RLC circuit is an electrical circuit consisting of a resistor (R), an inductor (L), and a capacitor (C), connected in series or in parallel. The properties of an RLC circuit can be changed by changing the resistance of the resistor R, the impedance of the inductor L and the capacitance of the capacitor C as well as adding single or groups of these devices to the circuit in parallel or in series. The resistance normally is tuned by a "battery" of resistances that are activated in series or parallel (e.g., by fusing or access transistors) or by controlling the resistance through a transistor or potentiometer.

These solutions are place consuming (battery of resistances, potentiometer), only once tunable (fusing) or power consuming (transistor).

According to an embodiment of the present invention, programmable resistances (e.g., technologies of CBRAM, PCRAM, Multilevel TS MRAM) are used as tunable resistors in RLC circuits. By using programmable resistances for a tunable resistor in RLC circuits, the RLC circuits can be tuned repeatedly. The implementation of one of these resistors is less place and current consuming than other implementations.

According to an embodiment of the present invention, programmable resistances (e.g., technologies of CBRAM, PCRAM, Multilevel TS MRAM) are used as a tunable resistor in RLC circuits.

According to an embodiment of the present invention, a CBRAM cell is implemented into a RLC circuit. The resistance is tuned by a certain-DC current through the device (applied voltage higher than Vton) which results in a certain programmed resistance. The RLC circuit is operated at amplitudes lower than |Vton| and |Vtoff| (threshold voltages for programming/erasing conductive paths within the CBRAM cell) for lower frequencies and amplitudes in order to ensure not to change the resistance for higher frequencies. A refresh of the resistance can be performed after a certain number of cycles in order to ensure a proper accuracy of the resistance.

According to an embodiment of the present invention, a multilevel TS MRAM cell is implemented into a RLC circuit. Tuning of the resistance is performed by heating up the cell to the blocking temperature $T_B$ and rotating the orientation of the top-pinning layer either by applying an external magnetic field or by using the magnetic field resulting out of the controlled current through two conductive wires on top or underneath the cell orthogonal to each other. The device is operated with taking care to stay under the blocking temperature of the top-pinning layer.

According to an embodiment of the present invention, a PCRAM cell is implemented into a RLC circuit. Tuning of the resistance is performed by a controlled heating current routed through the resistor. The RLC circuit is operated using currents that keep the resistance below Tg. A refresh of the resistance can be performed after a certain number of cycles in order to ensure a proper accuracy of the resistance.

As used herein the terms "connected" and "coupled" are intended to include both direct and indirect connection and coupling, respectively.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A tunable resistor, comprising:
   a resistor input terminal;
   a resistor output terminal;
   at least one current path coupled between the resistor input terminal and the resistor output terminal, wherein the at least one current path runs through at least one memory cell of an arrangement of programmable microelectronic memory cells; and
   a resistance adjusting means for adjusting the current path resistances of the current paths by programming the memory states of corresponding memory cells or activating/deactivating current paths such that the overall resistance between the resistor input terminal and the resistor output terminal is set to a predetermined resistance target value, wherein each memory cell comprises a current path input terminal and a current path output terminal, said terminals being used by the resistance adjusting means for applying a programming voltage across the memory cell in order to program the memory cell.

2. The tunable resistor according to claim 1, wherein the memory cells are part of a memory cell array of a programmable microelectronic memory device.

3. The tunable resistor according to claim 1, wherein the resistor is realized as a concatenation of several current paths which are coupled in series or in parallel.

4. The tunable resistor according to claim 1, wherein at least one of the programmable memory cells is a solid electrolyte random access memory (CBRAM) cell.

5. The tunable resistor according to claim 4, wherein the programming means programs the memory states of the CBRAM cells by forming or erasing conductive paths within the CBRAM cells.

6. The tunable resistor according to claim 1, wherein at least one of the programmable memory cells is a magneto-resistive random access memory (MRAM) cell.

7. The tunable resistor according to claim 6, wherein the programming means programs the memory states of the MRAM cells by changing the magnetic orientation within the MRAM cells.

8. The tunable resistor according to claim 1, wherein at least one of the programmable memory cells is a phase change random access memory (PCRAM) cell.

9. The tunable resistor according to claim 8, wherein the programming means programs the memory states of the PCRAM cells by causing phase transitions within the PCRAM cells.

10. An RLC circuit, comprising:
    a tunable resistor comprising a resistor input terminal, a resistor output terminal, and at least one current path connected between the resistor input terminal and the resistor output terminal, wherein at least one current path runs through at least one memory cell of an arrangement of programmable microelectronic memory cells;
    an inductor;
    a capacitor; and
    a resistance adjusting means for adjusting the current path resistances of the current paths by programming the memory states of corresponding memory cells or activating/deactivating current paths such that the overall resistance between the resistor input terminal and the resistor output terminal is set to a predetermined resistance target value.

11. The circuit arrangement according to claim 10, wherein an impedance of the inductor is tunable.

12. The circuit arrangement according to claim 11, wherein the impedance of the inductor is tunable to a impedance value zero.

13. The circuit arrangement according to claim 10, wherein a capacitance of the capacitor is tunable.

14. The circuit arrangement according to claim 13, wherein the capacitance of the capacitor is tunable to a capacitance value zero.

15. A method for operating a tunable resistor comprising a resistor input terminal, a resistor output terminal, and at least one current path connected between the resistor input terminal and the resistor output terminal, wherein at least one current path runs through at least one memory cell of an arrangement of programmable microelectronic memory cells, the method comprising:
    determining a resistance target value; and
    adjusting current path resistances of the current paths by programming the memory states of corresponding memory cells or activating/deactivating current paths such that an overall resistance between the resistor input terminal and the resistor output terminal is set to a predetermined resistance target value, wherein each memory cell comprises a current path input terminal and a current path output terminal, and wherein the adjusting process of a memory cell is carried out by applying a programming voltage across the memory cell using the corresponding current path input terminal and current path output terminal as voltage suppliers.

16. The method according to claim 15, wherein at least one of the programmable memory cells is a solid electrolyte random access memory (CBRAM) cell.

17. The method according to claim 16, wherein the resistance adjusting means programs the memory states of the CBRAM cells by forming or erasing conductive paths within the CBRAM cells.

18. The method according to claim 15, wherein at least one of the programmable memory cells is a magneto-resistive random access memory (MRAM) cell.

19. The method according to claim 18, wherein the resistance adjusting means programs the memory states of the MRAM cells by changing the magnetic orientation within the MRAM cells.

20. The method according to claim 15, wherein at least one of the programmable memory cells is a phase changing random access memory (PCRAM) cell.

21. The method according to claim 20, wherein the resistance adjusting means programs the memory states of the PCRAM cells by causing phase transitions within the PCRAM cells.

22. A method for operating a RLC circuit comprising a tunable resistor, an inductor, and a capacitor, wherein at least a part of the resistor is realized as a current path comprising at least one programmable microelectronic memory cell, the method comprising:

determining a resistance target value; and programming the memory state of at least one memory cell of the current path such that the resulting overall resistance of the current path is set to the resistance target value.

23. A computer program adapted to perform, when being carried out on a computing device or a digital signal processor, a method for operating a tunable resistor comprising a resistor input terminal, a resistor output terminal, and at least one current path connected between the resistor input terminal and the resistor output terminal, wherein at least one current path runs through at least one memory cell of an arrangement of programmable microelectronic memory cells, the method comprising:

determining a resistance target value; and adjusting current path resistances of the current paths by programming memory states of corresponding memory cells or activating/deactivating current paths such that an overall resistance between the resistor input terminal and the resistor output terminal is set to a predetermined resistance target value, wherein each memory cell comprises a current path input terminal and a current path output terminal, and wherein the adjusting process of a memory cell is carried out by applying a programming voltage across the memory cell using the corresponding current path input terminal and current path output terminal as voltage suppliers.

24. A data carrier storing a computer program according to claim 23.

25. A computer program adapted to perform, when being carried out on a computing device or a digital signal processor, a method for operating a RLC circuit comprising a tunable resistor, an inductor and a capacitor, wherein at least a part of the resistor is realized as a current path comprising at least one programmable microelectronic memory cell, the method comprising the following processes:

determining a resistance target value; and programming the memory state of at least one memory cell of the memory path such that the resulting overall resistance of the current path is set to the resistance target value.

26. A data carrier storing a computer program according to claim 25.

* * * * *